United States Patent
Tanaka

(10) Patent No.: US 9,991,461 B2
(45) Date of Patent: Jun. 5, 2018

(54) LIGHT EMITTING DEVICE

(71) Applicant: PIONEER CORPORATION, Bunkyo-ku, Tokyo (JP)

(72) Inventor: Akihiro Tanaka, Kawasaki (JP)

(73) Assignee: PIONEER CORPORATION, Tokyo (JP)

(*) Notice: Subject to any disclaimer, the term of this patent is extended or adjusted under 35 U.S.C. 154(b) by 0 days. days.

(21) Appl. No.: 15/558,173

(22) PCT Filed: Mar. 16, 2015

(86) PCT No.: PCT/JP2015/057633
§ 371 (c)(1),
(2) Date: Sep. 13, 2017

(87) PCT Pub. No.: WO2016/147285
PCT Pub. Date: Sep. 22, 2016

(65) Prior Publication Data
US 2018/0076409 A1    Mar. 15, 2018

(51) Int. Cl.
*H01L 29/08* (2006.01)
*H01L 35/24* (2006.01)
(Continued)

(52) U.S. Cl.
CPC ........ *H01L 51/5092* (2013.01); *H01L 51/001* (2013.01); *H01L 51/504* (2013.01);
(Continued)

(58) Field of Classification Search
CPC ............. H01L 51/5056; H01L 51/5072; H01L 51/5012; H01L 51/5092; H01L 51/5088; H01L 51/504
See application file for complete search history.

(56) References Cited

U.S. PATENT DOCUMENTS 7,273,663 B2    9/2007  Liao et al.
8,502,202 B2    8/2013  Nowatari et al.
(Continued)

FOREIGN PATENT DOCUMENTS

JP    2008-511100    10/2008
JP    2010-192719 A    9/2010
(Continued)

OTHER PUBLICATIONS

International Search Report for International Application No. PCT/JP2015/057633 dated Jun. 2, 2015, 2 pgs.

*Primary Examiner* — Zandra Smith
*Assistant Examiner* — John M Parker
(74) *Attorney, Agent, or Firm* — Procopio, Cory, Hargreaves & Savitch LLP

(57) ABSTRACT

Multiple organic layers (120) are located between a first electrode (110) and a second electrode (130), each organic layer including a light emitting layer. A charge generation layer (200) is located between mutually adjacent organic layers (120). In other words, the multiple organic layers (120) are mutually laminated and the charge generation layer (200) is located between the multiple organic layers (120). The charge generation layer (200) includes a first layer, a second layer, and a third layer. The first layer contains an electron transport material and the second layer contains a metal and a hole injection material. The third layer is formed using a hole transport material. The charge generation layer (200) contains an electron injection material for improving electron injection properties of the first layer, the charge generation layer provided on the first layer side than the second layer.

7 Claims, 11 Drawing Sheets

(51) Int. Cl.
 *H01L 51/00* (2006.01)
 *H01L 51/50* (2006.01)
 *H01L 51/56* (2006.01)

(52) U.S. Cl.
 CPC ...... *H01L 51/5072* (2013.01); *H01L 51/5088* (2013.01); *H01L 51/56* (2013.01); *H01L 51/007* (2013.01); *H01L 51/0065* (2013.01); *H01L 51/0072* (2013.01); *H01L 51/0077* (2013.01); *H01L 51/0081* (2013.01); *H01L 2051/0063* (2013.01); *H01L 2251/558* (2013.01)

(56) References Cited

U.S. PATENT DOCUMENTS

| | | | |
|---|---|---|---|
| 8,664,647 | B2 | 3/2014 | Nagai et al. |
| 8,987,726 | B2 | 3/2015 | Nagai et al. |
| 9,343,689 | B2 | 5/2016 | Nowatari et al. |
| 2004/0183066 | A1* | 9/2004 | Klubek ............... H01L 51/0058 257/40 |
| 2006/0040132 | A1 | 2/2006 | Liao et al. |
| 2008/0297036 | A1* | 12/2008 | Noh ....................... C09K 11/06 313/504 |
| 2010/0301317 | A1 | 12/2010 | Nowatari et al. |
| 2012/0119194 | A1 | 5/2012 | Nagai et al. |
| 2013/0228769 | A1* | 9/2013 | Zhou ................... H01L 51/5278 257/40 |
| 2013/0306949 | A1 | 11/2013 | Nowatari et al. |
| 2014/0001457 | A1 | 1/2014 | Endo |
| 2014/0225092 | A1 | 8/2014 | Nagai et al. |
| 2015/0155517 | A1* | 6/2015 | Lang ................... H01L 51/5084 257/40 |
| 2015/0188066 | A1* | 7/2015 | Song ................... H01L 51/002 257/40 |
| 2016/0240808 | A1 | 8/2016 | Nowatari et al. |
| 2016/0293879 | A1* | 10/2016 | Chen ................... H01L 51/5068 |
| 2017/0271414 | A1* | 9/2017 | Ohsawa ................. H01L 27/3206 |

FOREIGN PATENT DOCUMENTS

| | | |
|---|---|---|
| JP | 2012-195054 | 10/2012 |
| JP | 2014-110421 A | 6/2014 |
| JP | 2014-225470 A | 12/2014 |
| WO | 2011-010696 | 1/2011 |

* cited by examiner

LIGHT EMITTING DEVICE

The present application is a National Stage entry of PCT/JP2015/057633, filed on Mar. 16, 2015, the contents of which are incorporated by reference in its entirety.

TECHNICAL FIELD

The present invention relates to a light emitting device.

BACKGROUND ART

In recent years, there has been advancement in the development of light emitting devices with light emitting units having organic electroluminescence (EL) elements. An organic EL element is configured of an organic layer interposed between first and second electrodes. The organic layer is generally configured of a light emitting layer interposed between a hole injection layer and an electron injection layer.

On the other hand, as a method of increasing luminance of a light emitting device, there is a method of stacking the foregoing organic layers and disposing a charge generation layer between mutually adjacent organic layers, which is a so-called multiphoton light emission structure or a tandem structure. For example, Patent Document 1 discloses using a configuration of stacking an n-doped organic layer, a metal compound layer, and a p-doped organic layer in this order as a charge generation layer. Patent Document 1 discloses that the metal compound layer may be selected from titanium, zirconium, hafnium, niobium, tantalum, molybdenum, tungsten, manganese, iron, ruthenium, rhodium, iridium, nickel, palladium, platinum, copper, zinc, silicon, germanium, or a stoichiometric oxide or a nonstoichiometric oxide of a combination thereof.

Patent Document 2 discloses stacking LiF, Al, and 1,4,5,8,9,12-hexaazatriphenylene hexa-carbonitrile (HATCN) as a charge generation layer.

RELATED DOCUMENT

Patent Document

[Patent Document 1] Japanese Translation of PCT International Application Publication No. 2008-511100
[Patent Document 2] Japanese Laid-open Patent Publication No. 2010-192719

SUMMARY OF THE INVENTION

Technical Problem

Charge generation efficiency in a charge generation layer has a direct influence on luminance of a light emitting device. It is therefore desirable to improve the charge generation efficiency of the charge generation layer.

An exemplified problem to be solved of the invention is to improve charge generation efficiency of a charge generation layer in a light emitting device having the charge generation layer interposed between multiple organic layers.

Solution to Problem

According to claim 1 of the invention, there is provided a light emitting device including: a first electrode; a second electrode; a plurality of organic layers between the first electrode and the second electrode, each organic layer including a light emitting layer; and a charge generation layer between two mutually adjacent organic layers. The charge generation layer includes a first layer containing an electron transport material, a second layer containing a metal and a hole injection material, and a third layer containing a hole injection material. The charge generation layer contains an electron injection material between the second layer and the first layer or in the first layer. A content of the metal in the third layer is less than a content of the metal in the second layer.

BRIEF DESCRIPTION OF THE DRAWINGS

The above-described object, other objects, features, and advantages are more apparent in preferred embodiments to be described below and the following drawings appended to the embodiments.

DESCRIPTION OF EMBODIMENTS

Figure 1:
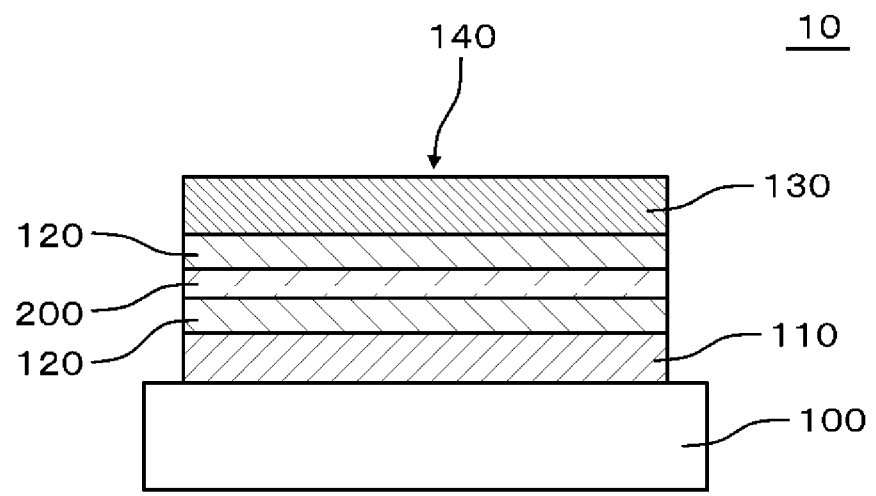
FIG. 1 is a sectional view illustrating the configuration of a light emitting device according to an embodiment.

Hereinafter, embodiments of the invention will be described with reference to the drawings. Throughout all the drawings, the same reference numerals are given to elements with the same configurations and the description thereof will not be repeated.

First Embodiment

Figure 2:
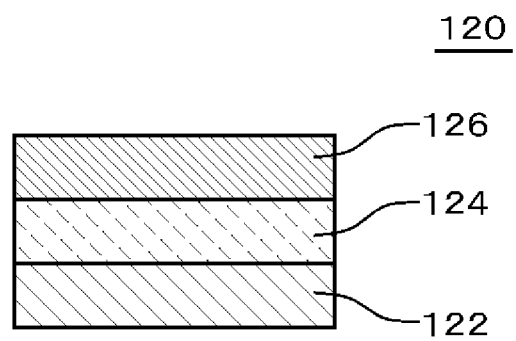
FIG. 2 is a sectional view illustrating the configuration of an organic layer.
Figure 3:
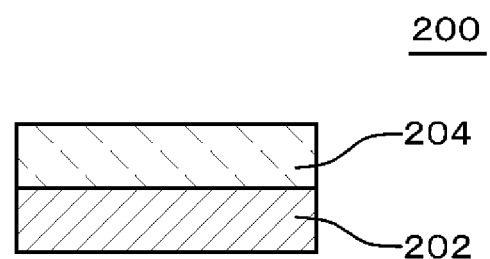
FIG. 3 is a sectional view illustrating the configuration of a charge generation layer.

FIG. 1 is a sectional view illustrating the configuration of a light emitting device 10 according to an embodiment. FIG. 2 is a sectional view illustrating the configuration of an organic layer 120 illustrated in FIG. 1. FIG. 3 is a sectional view illustrating the configuration of a charge generation layer 200 illustrated in FIG. 1. As illustrated in FIG. 1, the light emitting device 10 includes a first electrode 110, the second electrode 130, multiple organic layers 120, and a charge generation layer 200. The multiple organic layers 120 are located between the first electrode 110 and the second electrode 130 and each organic layer includes a light emitting layer 124, as illustrated in FIG. 2. The charge generation layer 200 is located between the mutually adjacent organic layers 120. In other words, the multiple organic layers 120 are mutually laminated with the charge generation layer 200 therebetween. The organic layer 120 can also be expressed as a light emitting unit. The light emitting device 10 can also include multiple light emitting units having different light emission colors with the charge generation layer 200 interposed therebetween. As illustrated in FIG. 3, the charge generation layer 200 includes a first layer 202 and a second layer 204. The first layer 202 contains an electron transport material and the second layer 204 contains a metal and a hole injection material. The charge generation layer 200 contains an electron injection material, for improving electron injection properties of the first layer 202, on the first layer 202 side than the second layer 204. In the example illustrated in FIG. 3, the electron injection material is contained in the first layer 202. Hereinafter, detailed descriptions will be made.

The light emitting device 10 is formed using a substrate 100. In a case in which the light emitting device 10 is a bottom emission light emitting device, the substrate 100 is formed of, for example, a light transmissive material such as glass or a light transmissive resin. Conversely, in a case in which the light emitting device 10 is a top emission light emitting device to be described below, the substrate 100 may be formed of a non-light transmissive material. The substrate 100 has, for example, a polygonal shape such as rectangular shape. Here, the substrate 100 may have flexibility. In a case in which the substrate 100 has flexibility, the thickness of the substrate 100 is, for example, equal to or greater than 10 µm and equal to or less than 1000 µm. In particular, in a case in which the substrate 100 is formed of glass, the thickness of the substrate 100 is, for example, equal to or less than 200 µm. In a case in which the substrate 100 is formed of a resin, the substrate 100 is formed using, for example, polyethylene naphthalate (PEN), polyether sulphone (PES), polyethylene terephthalate (PET), or polyimide. In a case in which the substrate 100 is formed of a resin, an inorganic barrier film made of $SiN_x$, SiON, or the like is formed on at least a light emitting surface (preferably, both surfaces) of the substrate 100 to prevent moisture from being transmitted through the substrate 100.

The light emitting unit 140 is formed on the substrate 100. The light emitting unit 140 includes an organic EL element. As illustrated in FIG. 1, the organic EL element is configured of the first electrode 110, the multiple organic layers 120, and the second electrode 130 laminated in this order. The charge generation layer 200 is located between the multiple organic layers 120. In the example illustrated in FIG. 1, the light emitting device 10 includes two organic layers 120. The charge generation layer 200 connects the two organic layers 120 to each other. Three or more organic layers 120 (so-called tridem structure) may be formed as long as a multiphoton structure is used. In this case, the charge generation layer 200 is positioned at two locations between the organic layers 120.

The first electrode 110 is a transparent electrode having light transmission properties. A transparent conductive material constituting the transparent electrode is a material containing a metal, for example, a metal oxide such as indium tin oxide (ITO), indium zinc oxide (IZO), indium tungsten zinc oxide (IWZO), or zinc oxide (ZnO). The thickness of the first electrode 110 is, for example, equal to or greater than 10 nm and equal to or less than 500 nm. The first electrode 110 is formed by, for example, sputtering or vapor deposition. The first electrode 110 may also be a conductive organic material such as carbon nanotubes or PEDOT/PSS.

The second electrode 130 includes a metal layer formed of a metal selected from a first group constituted of, for example, Al, Au, Ag, Pt, Mg, Sn, Zn, and In or a metal alloy selected from the first group. In this case, the second electrode 130 has light shielding properties. The thickness of the second electrode 130 is, for example, equal to or greater than 10 nm and equal to or less than 500 nm. Here, the second electrode 130 may be formed using a material exemplified as the material of the first electrode 110. The second electrode 130 is formed by, for example, sputtering or vapor deposition.

The materials of the foregoing first electrode 110 and second electrode 130 are examples for when light is transmitted through the substrate 100, that is, when light emitted from the light emitting device 10 is transmitted through the substrate 100 (bottom emission light transmitting device). As another case, there is a case in which light is transmitted through a side opposite to the substrate 100. That is, light emitted from the light emitting device 10 is not transmitted through the substrate 100 (top emission light emitting device). There are two types of laminating structures in the top emission light emitting device which are an inverted layer sequence and a standard layer sequence. In the inverted layer sequence, the material of the first electrode 110 and the material of the second electrode 130 are reversed to those of the bottom emission light emitting device. That is, the foregoing material of the second electrode 130 is used as the material of the first electrode 110 and the foregoing material of the first electrode 110 is used as the material of the second electrode 130. In contrast, in the standard layer sequence, the material of the first electrode 110 is formed on the foregoing material of the second electrode 130, the organic layer 120 is formed on the first electrode 110, and the second electrode 130, made into a thin film, is further formed on the organic layer 120, thus achieving a structure for taking out light from the side of the device opposite to the substrate 100. The light emitting device 10 according to the present exemplary embodiment may have any type of structure among the bottom emission light emitting device and the foregoing two types of top emission light emitting devices.

As illustrated in FIG. 2, the organic layer 120 includes the light emitting layer 124. Specifically, the organic layer 120 is configured by laminating the hole injection layer 122, the light emitting layer 124, and the electron injection layer 126. A hole transport layer may be formed between the hole injection layer 122 and the light emitting layer 124. In addition, an electron transport layer may be formed between the light emitting layer 124 and the electron injection layer 126. The organic layer 120 may be formed by vacuum vapor deposition. At least one layer of the organic layer 120, for example, a layer (the hole injection layer 122 in the example illustrated in FIG. 2) in contact with the first electrode 110, may be formed by coating such as inkjet, printing, or spraying. The remaining layers of the organic layer 120 may be formed by vacuum vapor deposition or by a coating method. For example, the multiple organic layers 120 formed in the light emitting device 10 may be formed by different methods in such a manner that the organic layer on the side of the first electrode 110 is formed by coating and the organic layer on the side of the second electrode 130 via the charge generation layer 200 is formed by vacuum vapor deposition.

As illustrated in FIG. 3, the charge generation layer 200 includes the first layer 202 and the second layer 204. The first layer 202 and the second layer 204 are formed by, for example, vacuum vapor deposition.

The first layer 202 contains an electron transport material. The electron transport material is, for example, Bphen (4,7-Diphenyl-1,10-phenanthroline). However, other electron transport materials may be used for the first layer 202. As another organic compound with electron transport properties, for example, a metal complex having at least one 8-quinolinolato or a derivative thereof as a ligand, such as Alq$_3$[tris(8-quinolinolato)aluminum], a triazole-based compound such as TAZ [3-(4-biphenyl)-5-(4-t-butylphenyl)-4-phenyl-1,2,4-triazole], or an oxadiazole-based compound such as PBD [2-(4-biphenyl)-5-(4-t-butyl)-1,3,4-oxadiazol] can be used. However, the invention is not limited to such materials. In the structure illustrated in the drawing, the first layer 202 contains an electron injection material that improves electron injection properties of the electron transport material in addition to the foregoing electron transport material. For example, Liq(8-Hydroxyquinolinolato-lithium) can be used as the electron injection material. However, the electron injection material is not limited thereto. As the electron injection material, an alkali metal such as LiF, Li$_2$O, or Li$_2$CO$_3$, an oxide, fluoride, or carbonate of an alkaline earth metal, an alkali metal such as lithium, sodium, calcium, or cesium, or an alkaline earth metal can be used. The thickness of the first layer 202 is, for example, equal to or greater than 5 nm and equal to or less than 150 nm and is preferably equal to or greater than 10 nm and equal to or less than 50 nm.

The second layer 204 contains a metal and a hole injection material. As the hole injection material, for example, a compound containing a hexaazatriphenylene derivative such as HATCN (1,4,5,8,9,12-Hexaazatriphenylene hexa-carbo-nitrile) can be used. A chemical formula of HATCN is represented by Chemical Formula (1) below.

[Chem. 1]

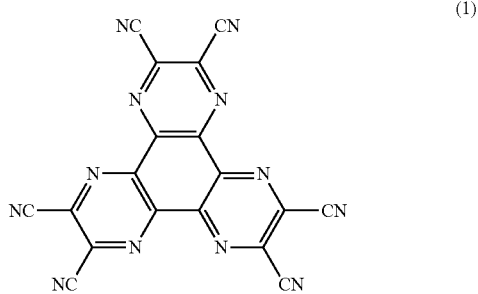

(1)

As a metal contained in the second layer 204, a Group 2 metal such as Mg or Ca is suitable. To form the second layer 204, the metal and the hole injection material may be heated in the same vacuum evaporation apparatus to be vapor deposited on the substrate 100. Here, a heating source for resistance heating can be used for vapor depositing the hole injection material. When Mg is the metal contained in the second layer 204, the heating source for resistance heating can also be used when vapor depositing the metal. Therefore, when the metal contained in the second layer 204 is Mg, and the organic layer 120 is formed by vacuum vapor deposition by resistance heating, it is not necessary to invest in a new facility, thereby lowering the manufacturing cost of the light emitting device 10.

Figure 10:
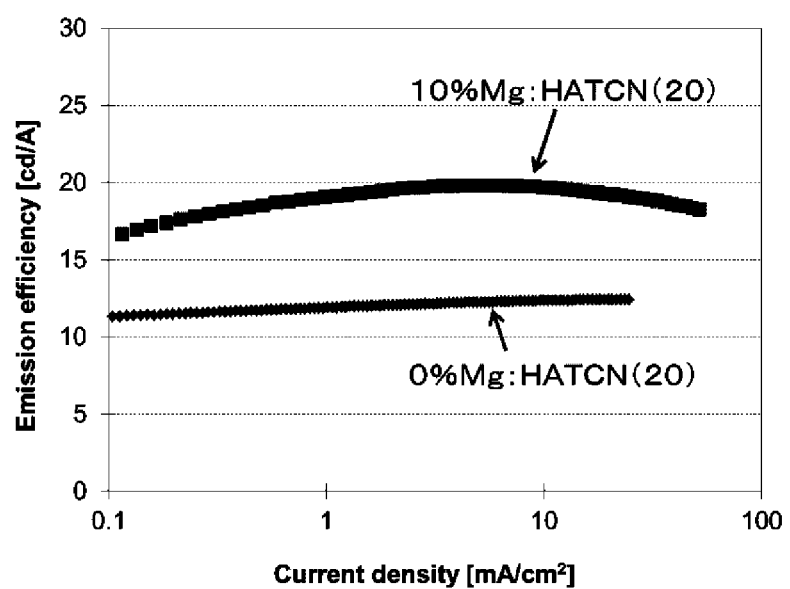
FIG. 10 is a graph illustrating data indicating current density and light emission efficiency in a light emitting device having a charge generation layer with a structure as illustrated in FIG. 3.

FIG. 10 is a graph illustrating data indicating current density and light emission efficiency in the light emitting device 10. The lower line of the graph is data of a light emitting element (HATCN layer) when the second layer 204 not containing a metal is formed on the first layer 202, in other words, when the second layer 204 is formed of only a hole injection material. The upper line of the graph is data of a light emitting element when the first layer 202 is formed the same as in the data of the lower line of the graph and the second layer 204 contains a metal material (specifically, Mg) at a volume ratio of 10%. In both light emitting elements, the structure of the first layer 202 is identical and the thickness of the second layer 204 is 20 nm. It can be seen from the graph that the light emitting element added with the metal material has higher emission efficiency than the light emitting element containing no metal material in the second layer 204. That is, it is clear that when the metal material is added to the second layer 204, the advantage (an increase in the luminance) by the tandem structure is increased.

The thickness of the second layer 204 is, for example, equal to or greater than 20 nm and equal to or less than 50 nm, but may be thinner than this range. For example, the thickness of the second layer 204 may be equal to or greater than 1 nm and equal to or less than 10 nm. A volume content of the metal (for example, Mg) contained in the second layer 204 is preferably equal to or greater than 10% and more preferably equal to or greater than 50%. The volume content is, for example, equal to or less than 90%. As a method of calculating the volume content of Mg, for example, secondary ion mass spectrometry (SIMS) or fluorescent X-ray spectrometry (XRF) can be used.

Next, a method of manufacturing the light emitting device 10 will be described. First, the first electrode 110 is formed on the substrate 100. Subsequently, the organic layer 120, the charge generation layer 200, and the organic layer 120 are formed in this order. Each of the charge generation layer 200 and the organic layer 120 may be further formed at least once on the upper organic layer 120. Subsequently, the second electrode 130 is formed on the uppermost organic layer 120.

As described above, according to the embodiment, the charge generation layer 200 includes the first layer 202 and the second layer 204. The first layer 202 contains the electron transport material and the second layer 204 contains the metal and the hole injection material. Such a configuration allows to improve the charge generation efficiency in the charge generation layer 200. Therefore, even when the multiple organic layers 120 are superimposed between the first electrode 110 and the second electrode 130, the light emission efficiency of each organic layer 120 is hardly lowered. Accordingly, it is possible to increase the luminance of the light emitting unit 140.

In a case in which a metal or a metal compound with a high melting point (high evaporation temperature in high vacuum) is used as a material contained in the second layer 204, it is necessary to use an electron beam evaporation source when the second layer 204 is formed. In the present embodiment, however, when Mg is used as a metal contained in the second layer 204, since the melting point (evaporation temperature in high vacuum) of Mg is relatively lower than other metal materials, the second layer 204 can be formed using only a resistance heating evaporation source. Therefore, when the organic layer 120 is formed by a resistance heating evaporation source, an additional evaporation source is not necessary. Accordingly, it is possible to lower the manufacturing cost of the charge generation layer 200.

Second Embodiment

Figure 4:
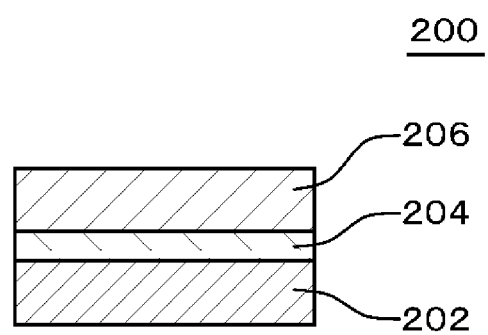
FIG. 4 is a sectional view illustrating the configuration of a charge generation layer according to a second embodiment.

FIG. 4 is a sectional view illustrating the configuration of a charge generation layer 200 included in a light emitting device 10 according to a second embodiment. FIG. 4 corresponds to FIG. 3 of the first embodiment. A light emitting device 10 according to the second embodiment has the same configuration as the light emitting device 10 according to the first embodiment except for the configuration of the charge generation layer 200.

In an example illustrated in FIG. 4, the charge generation layer 200 is configured by laminating a first layer 202, a second layer 204, and a third layer 206. The configurations of the first layer 202 and the second layer 204 are the same as those of the first embodiment. However, the thickness of the second layer 204 may be thinner than that of the first embodiment. The thickness of the second layer 204 is, for example, equal to or greater than 1 nm and equal to or less than 30 nm and more preferably equal to or greater than 1 nm and equal to or less than 10 nm.

The third layer 206 is formed using a hole injection material. The hole injection material is, for example, the same as the hole injection material contained in the second layer 204 but may be another material. The third layer 206 is formed using, for example, vacuum vapor deposition. The thickness of the third layer 206 is, for example, equal to or greater than 1 nm and equal to or less than 100 nm. The metal contained in the second layer 204 is not contained in the third layer 206. Here, the foregoing metal may diffuse from the second layer 204 to the third layer 206. In such a case, the content of the foregoing metal in the third layer 206 is less than the content of the foregoing metal in the second layer 204. The concentration of the metal in the third layer 206 decreases with distance from the second layer 204.

In a case in which the hole injection material of the third layer 206 is the same as the hole injection material contained in the second layer 204, the second layer 204 and the third layer 206 can be continuously formed using the same evaporation apparatus. Specifically, the second layer 204 is formed by vapor depositing the metal while vapor depositing the hole injection material. Then, when the thickness of the formed film reaches a thickness necessary as the thickness of the second layer 204, the vapor deposition of the metal is ended while continuing vapor deposition of the hole injection material. When such a method is used, it may be difficult to confirm an interface between the second layer 204 and the third layer 206 in some cases.

Also in the present embodiment, since the charge generation layer 200 includes the second layer 204, the charge generation efficiency in the charge generation layer 200 is increased as in the first embodiment. Accordingly, it is possible to increase the luminance of the light emitting unit 140. Further, since the third layer 206 is formed on the second layer 204, the second layer 204 (that is, the layer containing the metal) can be made thinner than in the first embodiment. By making the second layer 204 thin, transmittance of light of the charge generation layer 200 can be increased. Therefore, not only is extraction of light emitted from the organic layer 120 on the side of the second electrode 130 that is a nontransparent electrode at the bottom emission side facilitated but light emitted from the organic layer 120 on the first electrode 110 side is also reflected by the nontransparent electrode, to be extracted to the outside, thereby improving the light extraction efficiency of the light emitting device 10.

Figure 11:
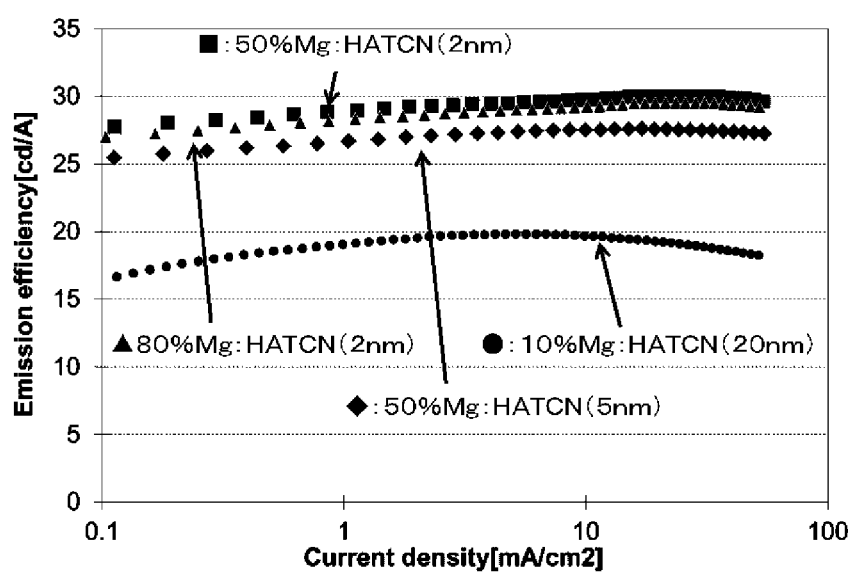
FIG. 11 is a graph illustrating data indicating current density and light emission efficiency in a light emitting device having a charge generation layer with a structure as illustrated in FIG. 4.

FIG. 11 is a graph illustrating a relation between current density and light emission efficiency of the light emitting device 10 according to the embodiment. Here, the film thickness of the second layer 204 is varied between 2 nm to 20 nm and the volume ratio of Mg is varied among 10%, 50%, and 80%. From the graph, it can be understood that the light emission efficiency of the light emitting device 10 is improved when the film thickness of the second layer 204 is changed from 5 nm to 2 nm.

Modification Example

Figure 5:
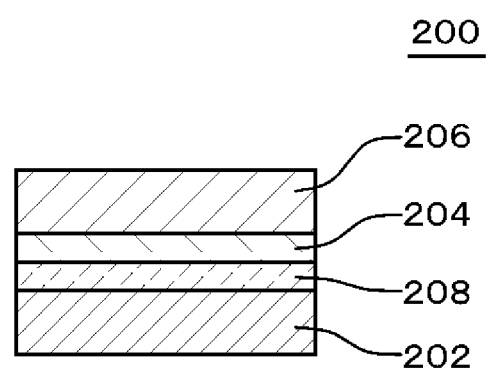
FIG. 5 is a sectional view illustrating the configuration of a charge generation layer according to a modification example.

FIG. 5 is a sectional view illustrating the configuration of a charge generation layer 200 included in a light emitting device 10 according to a modification example. FIG. 5 corresponds to FIG. 4 of the second embodiment. A light emitting device 10 according to the present example has the same configuration as the light emitting device 10 according to the first or second embodiment except for the configuration of the charge generation layer 200. The drawing illustrates the same case as that of the second embodiment.

In the embodiment, the first layer 202 contains no electron injection material. Instead, the charge generation layer 200 includes an electron injection layer 208 below the second layer 204 (for example, between the first layer 202 and the second layer 204). The electron injection layer 208 is formed using, for example, Liq. However, the electron injection layer 208 may be formed using another electron injection material such as an alkali metal such as $Li_2O$, LiF, or $Li_2CO_3$, an oxide or fluoride of an alkaline earth metal, or an alkali metal carbonate compound.

Also in the present modification example, since the charge generation layer 200 includes the second layer 204, the charge generation efficiency in the charge generation layer 200 is increased as in the first embodiment. Accordingly, it is possible to increase the luminance of the light emitting unit 140.

Example 1

Figure 6:
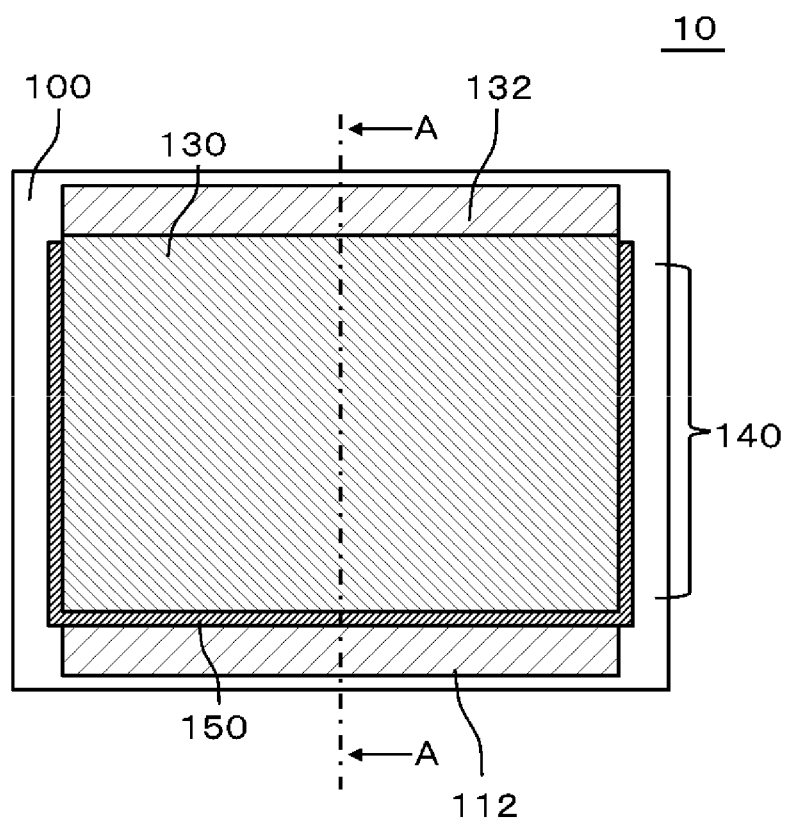
FIG. 6 is a plan view illustrating the configuration of a light emitting device according to Example 1.
Figure 7:
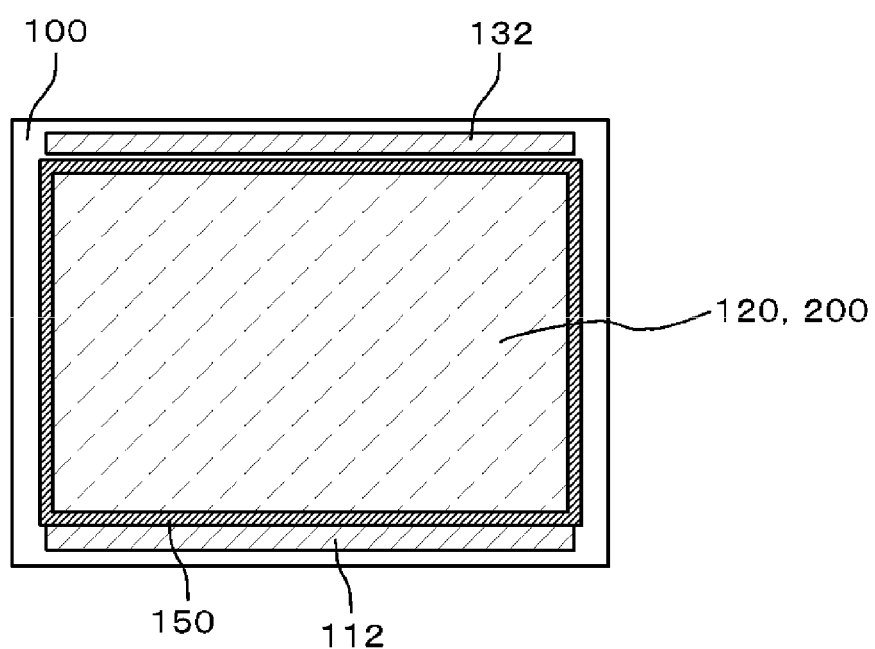
FIG. 7 is a diagram in which a second electrode is removed from FIG. 6.
Figure 8:
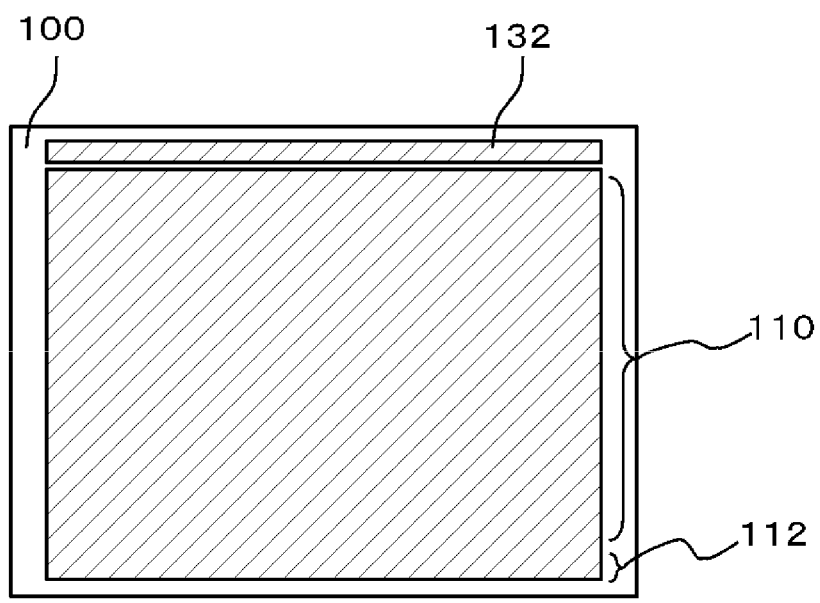
FIG. 8 is a diagram in which an organic layer, a charge generation layer, and an insulating layer are removed from FIG. 7.
Figure 9:
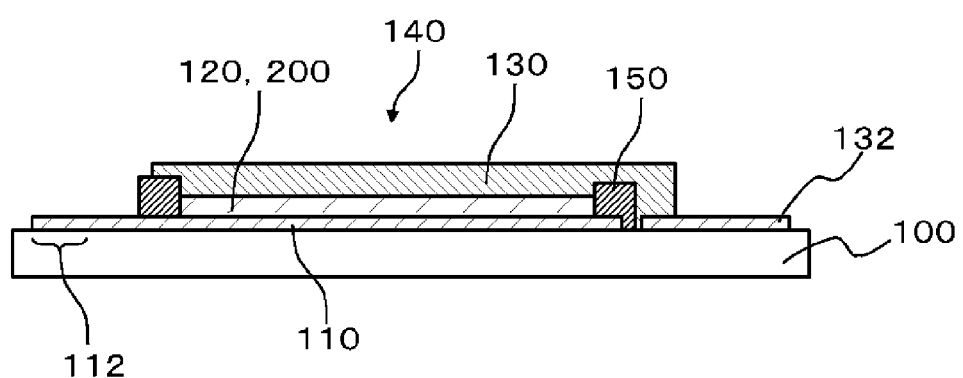
FIG. 9 is a sectional view taken along the line A-A of FIG. 6.

FIG. 6 is a plan view illustrating the configuration of a light emitting device 10 according to Example 1. FIG. 7 is a diagram in which the second electrode 130 is removed from FIG. 6. FIG. 8 is a diagram in which the organic layer 120, the charge generation layer 200, and the insulating layer 150 are removed from FIG. 7. FIG. 9 is a sectional view taken along the line A-A of FIG. 6.

In the present example, the light emitting device 10 is a lighting device and includes a substrate 100 and a light emitting unit 140. The configurations of the substrate 100 and the light emitting unit 140 have been described in the embodiments. Accordingly, the multiple organic layers 120 and the charge generation layer 200 are formed between the first electrode 110 and the second electrode 130.

The edge of the first electrode 110 is covered with an insulating layer 150. The insulating layer 150 is formed of, for example, a photosensitive resin material such as polyimide and surrounds a portion of the first electrode 110 to be a light emitting region of the light emitting unit 140. By providing the insulating layer 150, it is possible suppress short-circuiting between the first electrode 110 and the second electrode 130 at the edge of the first electrode 110. The insulating layer 150 is formed, for example, by coating a resin material to serve as the insulating layer 150 and then exposing and developing the resin material.

The light emitting device 10 includes a first terminal 112 and a second terminal 132. The first terminal 112 is connected to the first electrode 110 and the second terminal 132 is connected to the second electrode 130. The first terminal 112 and the second terminal 132 have, for example, a layer formed of the same material as the first electrode 110. An extraction interconnect may be provided between the first terminal 112 and the first electrode 110. An extraction interconnect may also be provided between the second terminal 132 and the second electrode 130.

Next, a method of manufacturing the light emitting device 10 will be described. First, the first electrode 110 is formed on the substrate 100. In this process, the first terminal 112 and the second terminal 132 are also formed. Subsequently, the insulating layer 150, the organic layer 120, the charge generation layer 200, and the second electrode 130 are formed in this order.

Also in the present example, since the charge generation layer 200 includes the second layer 204, the charge generation efficiency in the charge generation layer 200 is increased as in the first embodiment. Accordingly, it is possible to increase the luminance of the light emitting unit 140.

The embodiments and the example have been described above with reference to the drawings, but these embodiments and examples are merely examples. Various configurations can also be adopted in addition to the foregoing embodiments and examples.

The invention claimed is:

1. A light emitting device comprising:
   a first electrode;
   a second electrode;
   a plurality of organic layers between the first electrode and the second electrode, each organic layer comprising a light emitting layer; and
   a charge generation layer between two mutually adjacent organic layers,
   wherein the charge generation layer comprises:
      a first layer containing an electron transport material;
      a second layer containing a metal and a hole injection material; and
      a third layer containing a hole injection material,
   wherein the charge generation layer contains an electron injection material between the second layer and the first layer or in the first layer, and
   wherein a content of the metal in the third layer is less than a content of the metal in the second layer.
2. The light emitting device according to claim 1, wherein the metal is a Group 2 metal.
3. The light emitting device according to claim 2, wherein the metal is Mg.
4. The light emitting device according to claim 3, wherein a volume content of Mg in the second layer is equal to or greater than 10%.
5. The light emitting device according to claim 1, wherein a thickness of the second layer is equal to or greater than 1 nm and equal to or less than 10 nm.
6. The light emitting device according to claim 1, wherein the electron injection material is contained in the first layer.
7. The light emitting device according to claim 1, further comprising an electron injection layer between the second layer and the organic layer, the electron injection layer containing the electron injection material.

* * * * *